United States Patent [19]

Rao

[11] 4,246,692
[45] Jan. 27, 1981

[54] MOS INTEGRATED CIRCUITS WITH IMPLANTED RESISTOR ELEMENTS

[75] Inventor: G. R. Mohan Rao, Houston, Tex.

[73] Assignee: Texas Instruments Incorporated, Dallas, Tex.

[21] Appl. No.: 691,252

[22] Filed: May 28, 1976

[51] Int. Cl.³ .............................................. B01J 17/00
[52] U.S. Cl. ................................. 29/571; 29/576 C; 29/578; 29/577 R
[58] Field of Search ................. 29/571, 578, 576 OC, 29/577

[56] References Cited

U.S. PATENT DOCUMENTS

| | | | |
|---|---|---|---|
| 3,752,711 | 8/1973 | Kooi | 29/571 |
| 3,889,358 | 6/1975 | Bierhenke | 29/571 |
| 4,033,026 | 7/1977 | Pashley | 29/571 |

Primary Examiner—W. C. Tupman
Attorney, Agent, or Firm—John G. Graham

[57] ABSTRACT

Resistor elements for MOS integrated circuits are made by an ion implant step compatable with a self-aligned N-channel silicon-gate process. The resistor elements are beneath the field oxide in the finished device, although the implant step is prior to formation of the thick oxide. Resistors of this type are ideally suited for load devices in static RAM cells.

12 Claims, 12 Drawing Figures

MOS INTEGRATED CIRCUITS WITH IMPLANTED RESISTOR ELEMENTS

BACKGROUND OF THE INVENTION

This invention is directed to semiconductor devices and methods of making such devices, and more particularly to an improved resistor element for MOS integrated circuits.

In the earliest semiconductor integrated circuits, resistors were provided by diffused regions or by portions of the semiconductor substrate which were defined by etching, as seen in U.S. Pat. No. 3,138,743 issued to Jack S. Kilby and assigned to Texas Instruements. As the complexity of integrated circuits grew, the area occupied by resistors became more and more prohibitive, so logic forms were favored which did not require resistors. For example, "TTL" or transistor-transistor logic in bipolar was standard in digital equipment for a long period, and one of the features of TTL was minimizing the area on a bar dedicated to resistors. Integrated injection logic or $I^2L$ is a more recent bipolar form which does not need resistors. In MOS logic and memories, transistors are used as load devices or in other places were resistors are conventionally required. Examples of very complex MOS circuits containing many thousands of transistors but no resistors in a single chip digital processor or memory are shown in U.S. Pat. No. 3,940,747, issued to Kuo and Kitagawa and U.S. Pat. No. 3,900,722, issued to Michael J. Cochran et al, both assigned to Texas Instruments.

High density MOS memory devices such as the 4096 bit memory described in U.S. Pat. No. 3,940,747, or the "16K" or 16384 bit memory described in pending application Ser. No. 682,687, filed May 3, 1976, by N. Kitagawa, now abandoned, have been of the dynamic type because dynamic cells are smaller in area. In some parts of digital equipment, however, the refresh circuitry required for dynamic memories is incompatable, so static memory is used. Static cells traditionally employ six-transistor bistable or flip-flop circuits wherein transistors are used as load devices. These cells are much larger than the one-transistor cells of dynamic memory devices, so the density is less. Also, power dissipation is high due to the requirement that some current must flow through one side of each cell in the array to maintain the stored data.

It is a principal object of this invention to provide improved resistor elements for integrated circuits. Another object is to provide an improved static RAM cell for MOS memory devices. An additional object is to provide small area, high resistance load elements for transistors in semiconductor integrated circuits.

SUMMARY OF THE INVENTION

In accordance with this invention, a resistor element is provided by an ion implanted region which is located beneath a thick silicon oxide layer grown after the implant step. In an N-channel MOS process, the oxide layer would be "field oxide". In making the resistor, first the area which is to form the resistor element is implanted, using an appropriate mask, then field oxide is grown. The upper surface of the implanted region is consumed as the field oxide is grown; the remaining implanted material is of very high resistivity. For example, reproducible results at 1 megohm per square have been achieved. Resistor elements made by this technique are used as load devices in a static RAM cell which is of size comparable to dynamic RAM cells, making possible the substitution of static RAM's in applications traditionally requiring dynamic RAM's with their attendant refresh overhead.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 5a–5e are elevation views in section of the semiconductor device of FIGS. 1 and 3a–3d, at successive states in the manufacturing process.

DETAILED DESCRIPTION OF SPECIFIC EMBODIMENT

Figure 1:
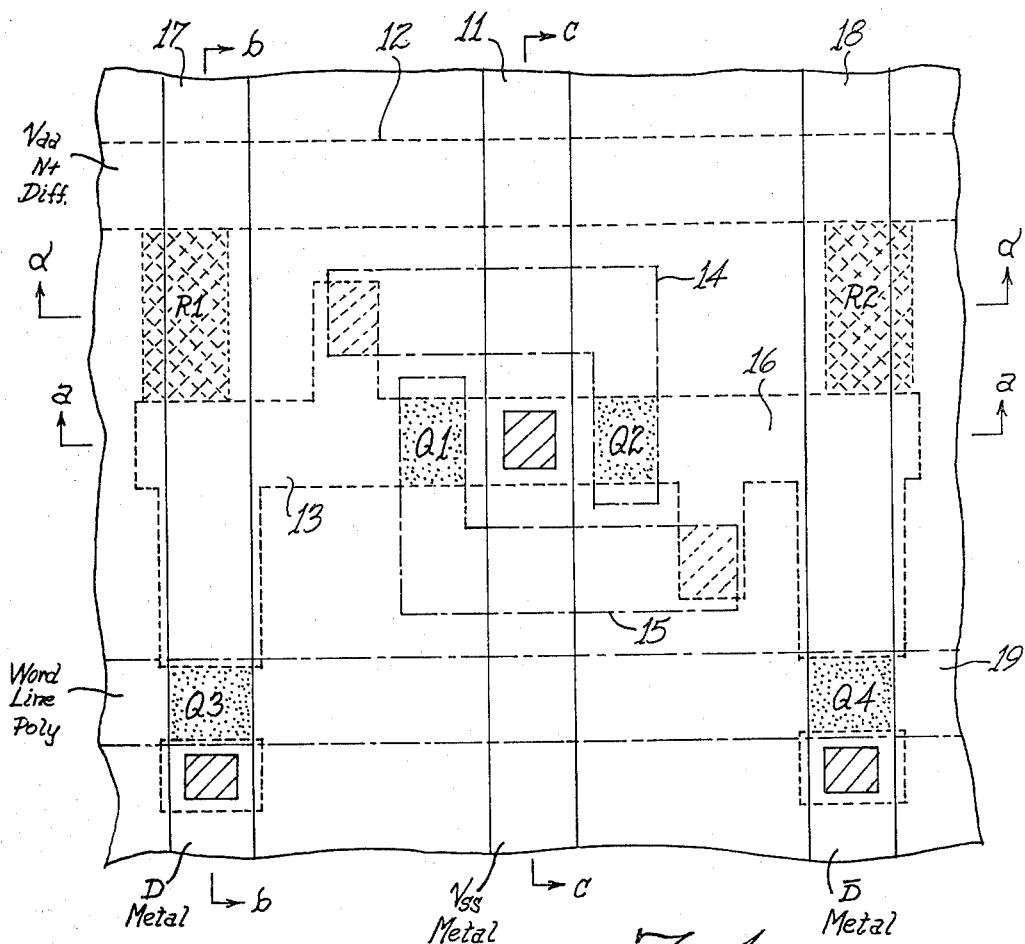
FIG. 1 is a greatly enlarged plan view of a small portion of a semiconductor chip showing the physical layout of a RAM cell using the resistors of the invention.

Referring to FIG. 1, a physical layout of an N-channel silicon gate MOS static RAM cell 10 is shown which utilizes the resistors of the invention. This cell is of course greatly enlarged in FIG. 1, as it would actually occupy less than 4 mils squared, i.e., the width deminsion of the cell of FIG. 1 would be less than 3 mils. The same cell is also shown in FIG. 2 drawn as an electrical schematic diagram, with the parts numbered and laid out the same.

Figure 2:
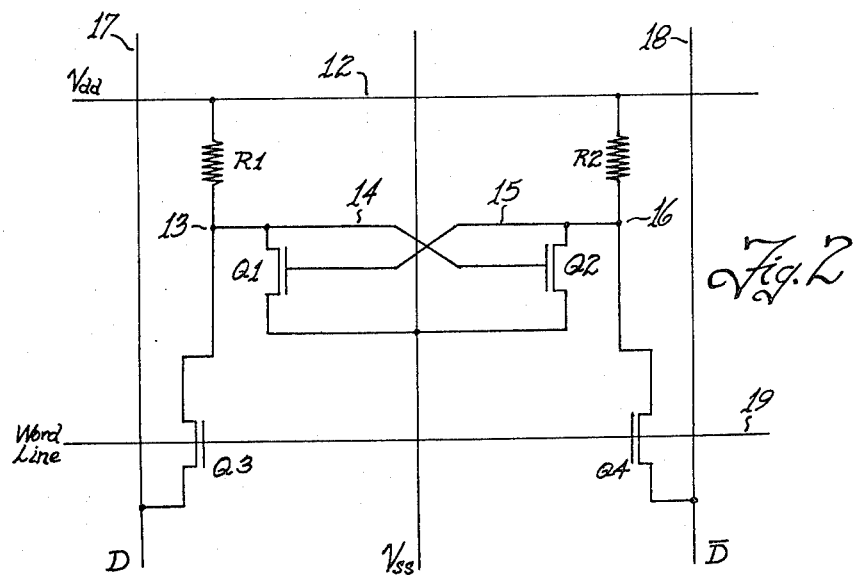
FIG. 2 is an electrical schematic diagram of the RAM cell of FIG. 1.

The cell of FIGS. 1 and 2 consists of a pair of cross-coupled driver transistors Q1 and Q2, each of which has it's source connected to ground or Vss line 11 and has it's drain connected to a Vdd or positive supply line 12 by a resistor R1 or R2. A node 13 at the drain of the transistor Q1 is connected to the gate of the transistor Q2 via a conductor 14, and in like manner a conductor 15 connects the gate of the transistor Q1 to a node 16 at the drain of the transistor Q2, providing the cross-coupling characteristic of bistable or flip-flop circuits. Digit lines 17 and 18, usually referred to as D and $\overline{D}$ or D0 and D1, are connected to the nodes 13 and 16 via coupling transistors Q3 and Q4, and the gates of both of these transistors are connected to a word address line 19.

In conventional static RAM cells, the circuit is the same as FIG. 2 except R1 and R2 are MOS transistors operating in the depletion mode, with their gates connected to their source or to nodes 13 and 16. These load devices, in discussing the prior art, will be referred to as Q5 and Q6; that is, the prior art is represented by FIG. 2 with transistors Q5 and Q6 in place of R1 and R2. In static RAM's it is preferred that the load devices exhibit very high resistance. In order for the standby current to be low, the load devices Q5 and Q6 must have high impedance. In the static or standby node, one of the transistors Q1 or Q2 will be conductive. This is necessary to store data. In a "4K" or 4096 bit memory device, all cells would be storing a one or zero, and all would have one of their transistors Q1 or Q2 conducting, so the power dissipation could be prohibitive if Q5 and Q6 were not highly resistive. During the switching mode, either node 13 or node 16 must charge up to about Vdd, so the load devices must not be off. Using depletion load transistors Q5 and Q6 in the "source follower" mode (or gate tied to source) the drain-to-source current will be $$I_{ds} = K'(W/L)V_{px}^2$$

where K' is a device constant, W is the width of the channel, L is the length of the channel, and Vpx is the threshold voltage. With the standard N-channel, self-aligned silicon gate process, using a gate oxide thickness of about 800 Å, Vpx should be 0.5 v±0.2 v, to obtain acceptable Ids. This is extremely difficult to obtain, from a production standpoint (for Vs=0 v.). Not only that, at the depletion load "Vs"=5 v (i.e., at nodes 13 or 16), Vpx should be about 0.1 v, in order for the Q5 or Q6 device to be conductive. These constraints make the conventional static RAM cell difficult to produce.

Figure 4:
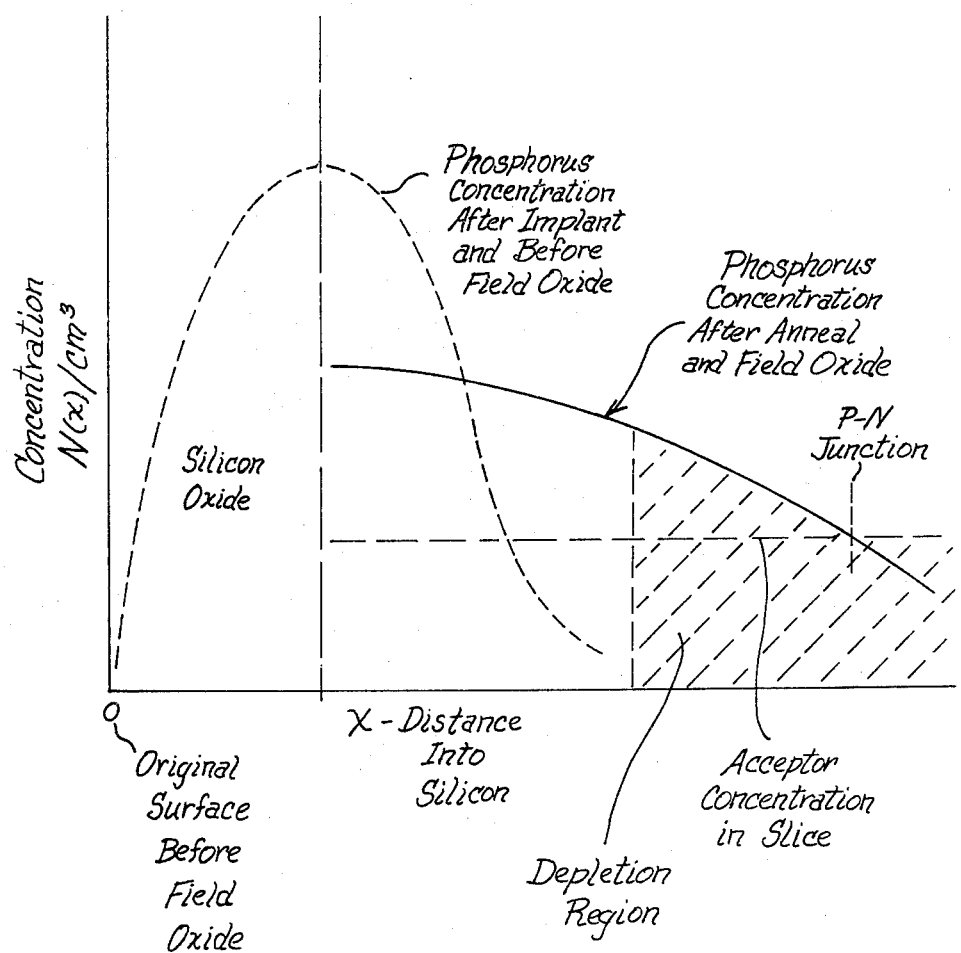
FIG. 4 is a graphic representation of phosphorus concentration as a function of distance for an implanted resistor.

High value resistors R1 and R2 between Vdd and the nodes 13 and 16 produce greatly improved results, compared to use of depletion load devices. Resistors made by diffusion are not acceptable, because diffusion sheet resistances of >100K ohm per square are impractical, and almost impossible. Surface resistors made by ion implant are similarly unacceptable. Consider a phosphorus implanted resistor, where sheet resistivity ρs would be $$\rho_s = \frac{1}{v\mu_n N} \text{ or } \int_0^x \frac{1}{v\mu_n N(x)}dx$$

where $\mu_n$ is the electron mobility (which is about 500 cm sq. per volt-sec for standard material), N is concentration in phosphorous impurity atoms per cm cubed, and v is unit charge. A graphic illustration of concentration N(x) as a function of distance X into the silicon surface is shown in FIG. 4. For an implant dosage of $1.0 \times 10^{11}$ atoms per cm sq.

$$\frac{1}{1.6 \times 10^{-19} \times 500 \times 10^{11}} = 125 \text{ K ohm/square}$$

This is prior to growing the field oxide over the resistor regions R1 or R2. When field oxide is grown, the implanted phosphorus is driven deeper into the native silicon, resistances of ten times greater, or about one megohm per square are achieved, according to the invention. Phosphorus will redistribute under the field oxide, and also some will be consumed by the oxide growth.

Referring to FIGS. 3a–3d, sectional veiws of the cell of FIG. 1 show the details of construction. The cell 10 is a small part of a substrate 20 of P-type silicon. The transistors Q1 and Q2 are formed by N+ diffused regions 21, 22 and 23 which create the source and drain regions. A thin gate dielectric layer 24 and phosphorus-doped polysilicon strips 25 and 26 form the gates of these transistors. The polysilicon strips 25 and 26 are parts of the cross-coupling interconnects 14 and 15. Thick field oxide 27 exists at all areas where N+ regions or transistors do not exist, and a P+ boron-doped channel-stop region 28 is created under all area of the field oxide 27 except where the resistors R1 and R2 are formed. An insulating layer 29 is formed over the entire top surface, overlying the polysilicon field oxide and N+ regions. The lines 11, 17 and 18 are metal strips overlying this insulating layer.

Figure 3A:
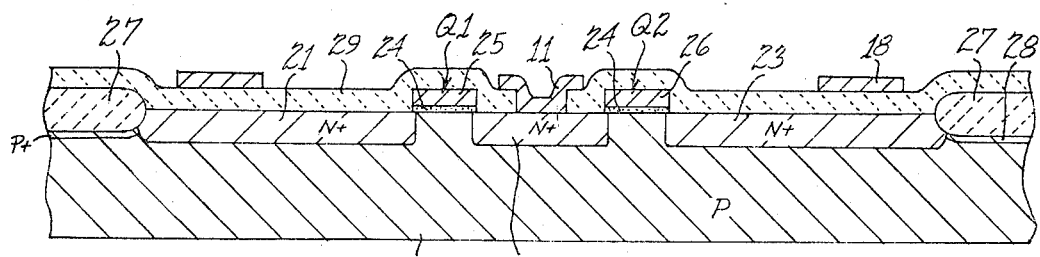
FIGS. 3a–3d are elevation views in section of the cell of FIG. 1, taken along the lines a—a, b—b, c—c and d—d, respectively.
Figure 3B:
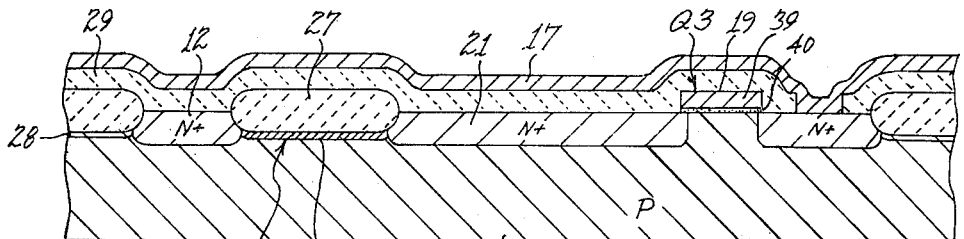
Figure 3C:
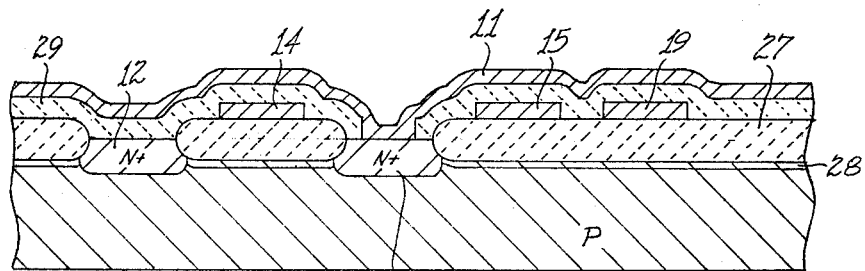
Figure 3D:
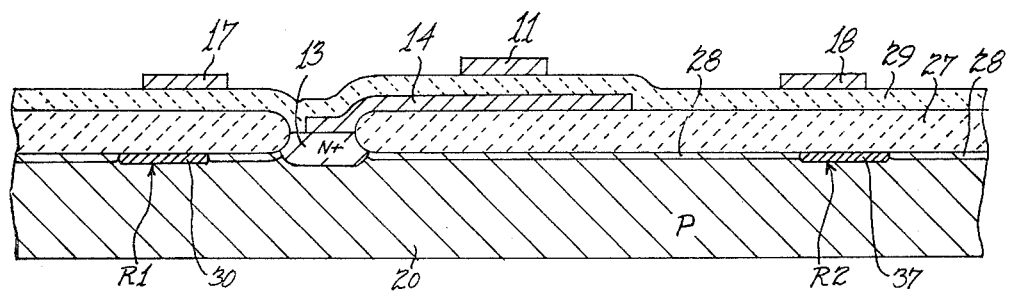

As seen in FIG. 3b, the resistor R1, according to the invention, consists of an ion-implanted phosphorus-doped region 30 beneath the field oxide 27. This N− region 30 connects the Vdd line 12, which is in the form of a diffused N+ region, to one edge of the diffused N+ region 21. The size of the resistor R1 (as well as R2) is about 0.2 mil×0.3 mil in area as seen in plan view of FIG. 1, and about 2000 to 8000 Å in "effective" thickness as seen in FIG. 3b. Diffusion of phosphorus is somewhat anomalous, so the precise thickness is not precisely defined. The resistors R1 and R2 are also seen in FIG. 3d, where the resistor R2 comprises a phosphorus implanted region 37.

Figure 5A:
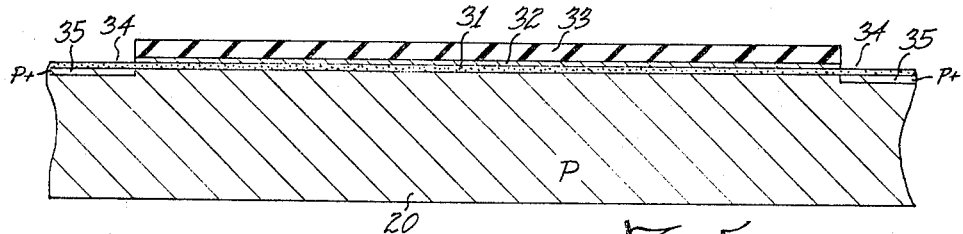
Figure 5B:
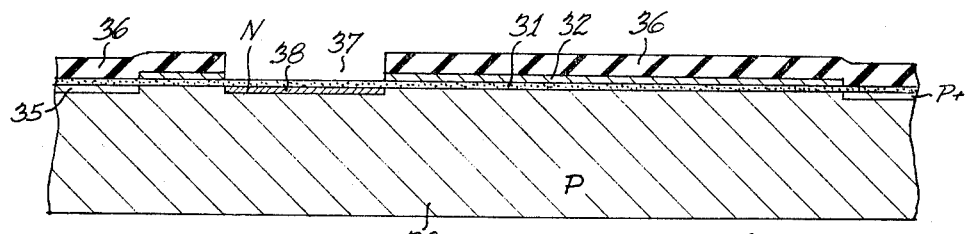
Figure 5C:
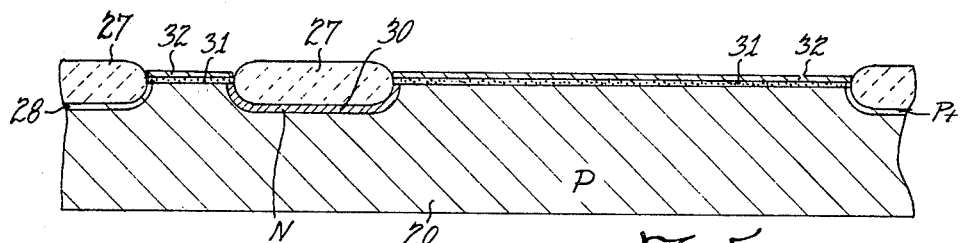

Referring now to FIGS. 5a–5e, a process for making the N-channel, silicon-gate, self aligned MOS integrated circuit device of FIGS. 1 and 3a–3d will be described. The starting material is a slice of P-type monocrystalline silicon, perhaps 3 inches in diameter and 20 mils thick, cut on the <100> plane, of a resistivity of about 6 to 8 ohm-cm. In FIGS. 3a or 5a, a wafer or body 20 represents a very small part of the slice, chosen as a representative sample cross section. First, after appropriate cleaning, the slice is oxidized by exposing to oxygen in a furnace at an elevated temperature of perhaps 1000° C. to produce an oxide layer 31 of a thickness of about 1000 Å. Next, a layer 32 of silicon nitride is formed by exposing to an atmosphere of silane and ammonia in an rf plasma reactor as shown in FIG. 2 of U.S. Pat. No. 3,907,616. Techniques for depositing nitride layers are also shown in British Pat. No. 1,104,935 and by Sterling and Swann, Solid State Electronics, Vol. 8, p. 653-54, 1965. This layer 32 is grown to a thickness of about 1000 Å. A coating 33 of photoresist is applied to the entire top surface, then exposed to ultraviolet light through a mask which defines the desired pattern, and developed. This leaves areas 34 where nitride is to be etched away. The slice is subjected to a nitride etchant, which removes the exposed part of the nitride layer 32 but does not remove the oxide layer 31 and does not react with the photoresist 13.

The slice is now subjected to an ion implant step, whereby boron atoms are implanted in the areas of silicon not covered by photoresist 33 and nitride 32. The photo-resist could have been removed, but preferably is left in place as it masks the implant. Boron is an impurity which produces P-type conductivity, so a more heavily doped P+ region 35 will be produced in the surface. The oxide layer 11 is left in place during the implant because it prevents the implanted boron atoms from out-diffusing from the surface during subsequent heat treatment. The boron implant is at a dosage of about $4 \times 10^{12}/\text{cm}^2$ at 100 KeV.

As will be seen, the region 35 does not exist in the same form in the finished device, because some of this part of the slice will have been consumed in the oxidation procedure.

In accordance with the invention, the next step in the process is to create the phosphorus implanted resistor regions. The photoresist coating 33 is removed and another photoresist coating 36 is applied over the entire slice, then exposed to UV light through a mask which exposes everything except what is to become the resistors R1 and R2 of FIG. 1. Upon developing, unexposed photoresist is removed in areas such as area 37 in FIG.

5b where resistor region 30 will be created. The nitride layer 32 is etched away in this area, the oxide 31 is left in place as before, and then the slice is subjected to a phosphorus implant at 150 KeV at a dosage of about $3 \times 10^{11}$/cm$^2$, producing an implanted region 38. The remaining photoresist 35 then would be removed.

As set forth in my patent application Ser. No. 648,593, filed Jan. 12, 1975, now U.S. Pat. No. 4,055,444, the next step in the process is to subject the slice to a heat treatment or annealling step, during which the slice is maintained at a temperature of about 1000° C. for perhaps approximately 2 hours in an inert atmosphere, preferably nitrogen. This step causes the boron concentration to change markedly, which has desirable effects aside from reduction in bulk damage in the crystal structure. The P+ region 35 as well as the N region 38 have now penetrated deeper into the silicon surface.

The following step in the process is formation of field oxide, which is done by subjecting the slices to steam or an oxidizing atmosphere at about 900° C. for perhaps 10 hours. This causes a thick field oxide region or layer 27 to be grown, and this region extends into the silicon surface because silicon is consumed as it oxidizes. The nitride layer 32 masks oxidation beneath it. The thickness of this layer 20 is about 8000 to 10,000 Å, half of which is above the original surface and half below. The boron doped P+ region 35 and the phosphorus doped N region 38 formed by implant and modified by the anneal step will be partly consumed, but will also diffuse further into the silicon ahead of the oxidation front. Thus, a P+ region 28 and the N resistor region 30 will result which will be deeper and of more uniform and acceptable concentration at the surface compared to what would have resulted without the anneal step. Also, the regions 28 and 30 will not have the extent of crystalline structure damage characteristic of implanted devices.

Figure 5D:
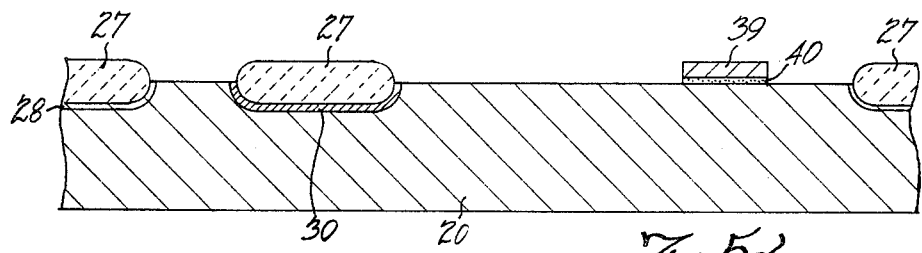

The nitride layer 32 and its underlying oxide layer 31 are removed by etching, as the next step, and another thin oxide layer of about 800 Å is grown over the exposed areas of silicon. Windows for polysilicon to silicon contacts are patterned and etched using photoresist. A layer of polycrystalline silicon is deposited in a reactor using standard techniques. The polysilicon and gate oxide or thin oxide layers are next patterned by applying a layer of photoresist, exposing to ultraviolet light trhough a mask prepared for this purpose, developing, then etching with the remaining photoresist masking certain areas of the polysilicon. The resulting structure is seen in FIG. 5d, where a part of the remaining polysilicon layer provides what will be the gate 39 of MOS transistor Q3, and thin oxide underneath it is the gate oxide 40 of the transistor. These same layers also provide gate and gate oxide for all the other transistors on the slice, and where needed, capacitors, wherein the thin oxide is the dielectric layer and the polysilicon layer, acting merely as a conductor, is one plate of a capacitor.

Using the polysilicon 39 and thin oxide 40 as a diffusion mask, the slice is now subjected to an N+ diffusion, whereby phosphorus is diffused into the silicon slice 20 to produce regions 12, 21, 22 and 23. The depth of diffusion is about 8,000 to 10,000 Å. The N+ diffused regions function as conductors which connect the various regions together, and also function as the source or drain regions of all the MOS transistors.

As seen in FIG. 3b, fabrication of the device is continued by depositing another layer 29 of phosphorus-doped oxide. Rather than by oxidizing, this is done by a low temperature reaction process using conventional chemical vapor deposition techniques. A layer 29 of about 6,000 Å is produced, covering the entire slice. Subsequently, windows are opened in the oxide layer 29 in places where contact is to be made to regions of the silicon or to the polysilicon layer (none seen in FIG. 3b), using photoresist masking and etching. Then, a layer of aluminum is deposited on the entire slice, and etched away using photoresist masking to provide the desired pattern of metal interconnections 11, 17 and 18.

The resistance of the regions 30 or 37 will be dependent upon substrate bias and source bias. Often N-channel silicon-gate devices have a bias of $-3$ or $-5$ volts on the substrate, as is standard practice. The effect on the resistor would be an increase in resistance as substrate bias increased because the "channel" or current path will tend to be depleted of minority carriers, electrons in this case. "Source" bias or Vs has the same effect. By source bias is meant the voltage across the resistor from one end (Vdd side) to the other (the node 13 or 16). For example, in the circuit of FIG. 2, one driver transistor is on and one is off under static conditions, so the voltage on one node 13 or 16 is about Vdd and the other is near Vss; this voltage across the resistor R1 or R2 is referred to as source bias, and increasing source bias Vs increases the resistance.

In a first example, using the N$_2$ anneal step as included above, for a Vdd of 5.5 v and a substrate bias or Vbb of zero, and for five parallel resistors each 0.2 mil wide and 1.0 ml long (a measure of ohms per square), the resistance produced by a $2 \times 10^{11}$ dosage varied from about 3.5 to 7 Meg ohm, at $3 \times 10^{11}$ from 0.7 to 1 Meg ohm, and at $4 \times 10^{11}$ dosage from 250 to 300K ohm, all at 150 KeV.

In a second example, without the N$_2$ anneal step, and with a $-3$ v. substrate bias, otherwise the same conditions as the previous example, the resistance was about 35K ohm for dosages of $10 \times 10^{11}$ and Vs=0, and was about 50K ohm for Vs=5 v. At dosage of $7 \times 10^{11}$/cm$^2$, the Vs=0 value was 40K and Vs=5 was 100 to 150K. Dosage of $5 \times 10^{11}$ produced resistivity of 90 to 100K ohm with Vs=0 and 2 to 3 Meg ohm for Vs=5.

A third example used the same conditions as the first, for $10 \times 10^{11}$ dosage, the resistance is about 30K ohm for Vs=5 v. For $7 \times 10^{11}$ dosage, Vs=0 produces about 40K ohm and Vs=5 v about 100 to 150K ohm. At $5 \times 10^{11}$ dosage, Vs=0 results in 100K and Vs=5 v about 250 to 300K ohm. At $2 \times 10^{11}$, Vs=0 produces 1 to 1.5 Meg and for Vs=5 v the resistivity goes off the scale, probably greater than 100 Meg ohm.

While this invention has been described with reference to an illustrative embodiment, it is not intended that this description be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making resistor elements in N-channel, silicon-gate MOS integrated circuit devices, comprising the steps of:

growing a thin silicon oxide coating on a surface of a monocrystalline silicon slice containing a first conductivity type determining impurity;

covering the thin silicon oxide coating with a thin layer of silicon nitride;

removing the silicon nitride coating in a pattern to expose selected resistor areas;

implanting a second conductivity-type determining impurity opposite the first type into a shallow surface-adjacent region of the silicon in said resistor areas by exposing the slice to an ion beam, such implanting being done through said thin silicon oxide coating;

subjecting the slice to an elevated temperature in an inert atmosphere to raise the concentration of the first impurity below said surface-adjacent region;

oxidizing the slice at an elevated temperature for a time exceeding that used in the prior step to create a thick silicon oxide coating in said exposed areas and covering the resistor areas;

forming an electrical connection to each of a plurality of spaced portions of the implanted region in said resistor area;

removing the remaining silicon nitride from the surface of the slice; and forming MOS transistors on said slice by diffusing or implanting into the slice said second conductivity-type determining impurity creating regions in the slice contiguous to said resistor areas.

2. A method according to claim 1 wherein the silicon slice is predominantly of P-type of low impurity concentration, and the second impurity is phosphorus.

3. A method according to claim 2 wherein the step of subjecting the slice to an ion implant is at a dosage equivalent to about 2 to $6 \times 10^{11}/cm^2$ at about 150 KeV.

4. A method according to claim 3 wherein the dosage is no more than about $3 \times 10^{11}/cm^2$.

5. A method according to claim 2 wherein the step of implanting produces a dosage of no more than the equivalent of about $4 \times 10^{11}$ atoms of phosphorus per square centimeter at an energy of about 150 KeV.

6. A method according to claim 1 wherein the step of oxidizing the slice consumes part of said shallow surface-adjacent region produced by the step of implanting and drives impurities deeper into the slice.

7. A method making resistor elements in a silicon slice in manufacture of MOS integrated circuits of the type having MOS transistors, comprising:

implanting conductivity-type determining impurity material in selected resistor areas at the surface of the silicon slice;

and thereafter oxidizing selected regions of said surface by heating the slice in an oxidizing atmosphere, producing thick field oxide which covers said selected resistor areas, and forming said MOS transistors with gate oxide much thinner than the field oxide.

8. A method according to claim 7 wherein contact areas are formed in said surface of the slice by diffusing said conductivity-type determining impurity into regions contiguous to the resistor areas.

9. A method according to claim 8 wherein the implanting is of equivalent to a dosage of about 2 to about $4 \times 10^{11}$ phosphorus atoms per $cm^2$ at 150 KeV.

10. A method of making a circuit element in a semiconductor integrated circuit, comprising the steps of:

implanting conductivity-type determining impurity material in a selected area in a face of a semiconductor body to produce an implanted region of opposite conductivity-type from the bulk of the body; covering the face of the body with a thick oxide coating by heating in an oxidizing atmosphere, consuming the bulk of said region and driving said impurity material further into said face of the body, while masking contact areas on opposite ends of the selected area to prevent oxidation thereof; and introducing conductivity-type determining impurity into the contact areas to provide electrical connection to the circuit element.

11. A method according to claim 10 wherein the semiconductor body is predominately P-type silicon and the impurity material is phosphorus.

12. A method according to claim 11 wherein the step of introducing is diffusion which uses another mask of silicon oxide much thinner than said thick oxide to define other circuit components.

* * * * *